United States Patent [19]
Kiyokawa et al.

[11] Patent Number: 5,742,168
[45] Date of Patent: Apr. 21, 1998

[54] TEST SECTION FOR USE IN AN IC HANDLER

[75] Inventors: Toshiyuki Kiyokawa, Kuki; Keiichi Fukumoto, Gyoda, both of Japan

[73] Assignee: Advantest Corporation, Tokyo, Japan

[21] Appl. No.: 691,724

[22] Filed: Aug. 2, 1996

[30] Foreign Application Priority Data

Aug. 4, 1995 [JP] Japan .................................. 7-199926

[51] Int. Cl.$^6$ .................................................. G01R 31/02
[52] U.S. Cl. ............................................ 324/754; 324/760
[58] Field of Search .................................. 324/754, 755, 324/758, 760, 158.1

[56] References Cited

U.S. PATENT DOCUMENTS

| | | | |
|---|---|---|---|
| 3,408,565 | 10/1968 | Frick et al. | 324/760 |
| 3,412,333 | 11/1968 | Frick et al. | 324/760 |
| 4,757,255 | 7/1988 | Margozzi | 324/760 |
| 4,926,117 | 5/1990 | Nevill | 324/760 |
| 5,227,717 | 7/1993 | Tsurishima et al. | 324/754 |
| 5,451,866 | 9/1995 | Drach et al. | 324/760 |

*Primary Examiner*—Ernest F. Karlsen
*Assistant Examiner*—Anh Phung
*Attorney, Agent, or Firm*—Staas & Halsey

[57] ABSTRACT

A test section for use in an IC handler capable of testing even high speed operating IC devices with precision is provided. A mounting fixture 62 for connecting a test head 32 of an IC tester with the constant temperature chamber 20 of the IC handler is configured to be detachable with respect to the base 10a of the body of the IC handler, and a socket guide 70 having IC sockets mounted therein is also configured to be detachable with respect to the mounting fixture 62. With this construction, it is possible to minimize the length of the electric path between the performance board 35 and the terminals of the IC sockets. In addition, the IC sockets may be mounted even directly on the performance board 35. It is thus possible to carry out the testing utilizing all types of test heads by preparing various mounting fixtures matching with the test heads used.

4 Claims, 6 Drawing Sheets

5,742,168

TEST SECTION FOR USE IN AN IC HANDLER

FIELD OF THE INVENTION

The present invention relates to a semiconductor device transporting and handling or processing apparatus (commonly called IC handler) for transporting semiconductor devices (typically semiconductor integrated circuits) to test and sort out the tested semiconductor devices on the basis of the test results, and particularly to the construction of the test or testing section of the IC handler where devices to be tested (commonly called DUT) as transported are tested and measured.

BACKGROUND ART OF RELATED ART

A semiconductor device testing apparatus (commonly called IC tester) for testing semiconductor devices (typically semiconductor integrated circuits, as will be referred to as IC) employs an IC handler for transporting ICs to be tested to subject them to a predetermined test and sort out the tested ICs on the basis of the test results, and usually has such an IC handler integrally mounted thereto.

An example of the prior art IC handler called "forced horizontal transporting system" is shown in the form of a flow chart in FIG. 4. The illustrated IC handler 10 comprises a loader section 11 where ICs 15 to be tested which a user has beforehand loaded on a customer (user) tray 13 are transferred and reloaded onto a test tray 14 capable of withstanding high/low temperatures, a constant temperature chamber 20 including a test or testing section 21 for receiving and testing the ICs from the loader section 11, and an unloader section 12 where the tested ICs 15 which have been carried on the test tray 14 subsequently to undergoing a test in the test section 21 are transferred from the test tray 14 to the customer tray 13 to be reloaded on the latter (generally, the tested ICs are often sorted out by categories based on the data of the test results and transferred onto the corresponding customer trays). Depending upon the type of ICs to be tested (in the case of the surface mount type ICs or the like each packaged in a dual-in-line flat package, for example), each IC to be tested may be loaded on an IC carrier, and then the IC carrier loaded with the IC may be placed on a customer tray.

The test tray 14 is moved in a circulating manner from and back to the loader section 11 sequentially through the constant temperature chamber 20 and the unloader section 12. More specifically, the test tray 14 loaded with ICs 15 to be tested is transported from the loader section 11 to a soak chamber 22 within the constant temperature chamber 20 where the ICs 15 placed on the tray 14 are heated or cooled to a predetermined constant temperature. Generally, the soak chamber 22 is adapted to store a plurality of (say, ten) test trays 14 stacked one on another such that a test tray 14 newly received from the loader section 11 is stored at the bottom of the stack while the uppermost test tray is delivered to the test section 21.

The ICs 15 to be tested are heated or cooled to a predetermined constant temperature while the test tray 14 is moved from the bottom to the top of the stack within the soak chamber 22. The ICs 15 heated or cooled to the constant temperature and loaded on the test tray 14 are then transported while maintained at the constant temperature from the soak chamber 22 to the test section 21 where the ICs to be tested are brought into electrical contact with IC sockets (not shown) disposed in the test section 21 to be measured for their electric characteristics.

After completion of the test, the tested ICs 15 are transported from the test section 21 to an exit chamber 23 where they are restored to the ambient temperature. Like the soak chamber 22, the exit chamber 23 is also adapted to accommodate test trays in the form of a stack. For example, the arrangement is such that the tested ICs 15 are brought back to the ambient temperature as the associated test tray is moved sequentially from the top to the bottom of the stack within the exit chamber 23. Thereafter, the tested ICs 15 as carried on the test tray 14 are transported to the unloader section 12 where the tested ICs are sorted out by categories based on the test results thereof and transferred onto the corresponding customer trays 13. The test tray 14 emptied in the unloader section 12 is delivered back to the loader section 11 where it is again loaded with ICs 15 to be tested from the customer tray 13, and the above process is repeated.

It is to be noted that the transfer of ICs already tested as well as ICs to be tested between the customer tray 13 and the test tray 14 is typically effected by suction transport means utilizing a vacuum pump which may pick up one to several ICs at a time for the transfer.

While the IC handler 10 illustrated in FIG. 4 is of the type which is configured to transport ICs to be tested as placed on the tray, IC handlers of the type adapted to transport ICs to be tested individually are also currently used.

As described above, ICs 15 to be tested are transported by the IC handler from the loader section 11 to the test section 21 from where upon the test being completed the ICs are conveyed from the test section 21 to the unloader section 12. In the test section 21, ICs to be tested are brought into electrical contact with IC sockets through which a test signal having a predetermined pattern is supplied from the IC tester to undergo a test for their electric characteristics. The test section 21 of the IC handler is disposed inside the constant temperature chamber 20 to meet the requirement that ICs to be tested be tested in an atmosphere at a predetermined temperature. It is also required that the IC sockets be disposed inside the constant temperature chamber 20 in a thermally insulated condition.

In the prior art as illustrated in FIG. 5 by way of example, the test section 21 of the IC handler conducts a test for ICs to be tested by fitting and attaching a mounting fixture 33 (which is a jig known as "Hi-fix base" or "test fixture") for connecting the test head 32 of the IC tester with the constant temperature chamber 20 to an opening 31 generally angular U-shaped in a plan view (such as a generally angular U-shaped cut-out extending from the front as viewed in the drawing) formed in that portion of the base 10a of the IC handler body corresponding to the bottom of the constant temperature chamber 20 as well as in the bottom of the chamber. In the illustrated example, the mounting fixture 33 is in the form of a box generally rectangular in a plan view, on top of which IC sockets 34a and 34b are mounted. The arrangement is such that the IC sockets 34a and 34b are exposed in the constant temperature chamber 20 so as to receive ICs to be tested as conveyed into the test section 21 in the chamber 20 for testing of the electrical characteristics of the ICs. While two IC sockets 34a and 34b are shown as mounted in the illustrated example, this is only because the test section 21 of the IC handler in this example is designed to test two ICs at one time. It is needless to say the number of IC sockets may be varied depending on the type of the IC handler.

The constant temperature chamber 20 is of an insulated construction with the bottom insulation wall 20a affixed to the base 10a of the IC handler body to define a double-walled construction with the base 10a backed by the overlying insulation wall 20a. Accordingly, the aforesaid opening 31 is formed through both the base 10a and the bottom insulation wall 20a of the chamber 20. Once the mounting fixture 33 is installed in the opening 31, the front (as viewed in the drawing) insulation wall of the constant temperature chamber 20 is closed as a matter of course to maintain the interior of the chamber in an insulated condition.

On the other hand, the mounting fixture 33 has a top wall 33a, side walls 33b and mounting ledges (flanges) 33c horizontally extending from the side walls 33b, all being insulation walls made of an insulating material. The mounting fixture 33 is hermetically fixed to the bottom of the constant temperature chamber 20 so that the interior of the chamber is maintained in a thermally insulated condition, by securing the mounting ledges 33c to the recessed shoulders formed in the bottom insulation wall 20a of the chamber 20 by means of fastening means such as screws, not shown. It is thus to be understood that the box-shaped mounting fixture 33 forms a part of the constant temperature chamber 20 of the IC handler.

The mounting fixture 33 is fixed to the top of a performance board 35 which is in turn fixed to the top of the test head 32 of the IC tester. On the other hand, the aforesaid IC sockets 34a and 34b are mounted in a socket guide 36 which is in turn mounted on the top wall 33a of the mounting fixture 33 through a socket board 37. The performance board 35 and the IC sockets 34a and 34b are electrically connected through the socket board 37 by connecting cables 38 extending through the interior of the mounting fixture 33 so that a test pattern signal corresponding to the ICs to be tested from the test head 32 are applied through the performance board 35 and socket board 37 to the associated terminals of the IC sockets 34a and 34b to test the ICs. It is to be understood that the electrical connecting means other than the cables 38 such as a vertically oriented printed circuit board or socket may be used to electrically connect the performance board 35 with the socket board 37 or the performance board 35 may be directly connected to the terminals of the IC sockets 34a and 34b without using the socket board 37.

The socket guide 36 described above is to guide and mount the ICs 15 to be tested as conveyed from the test tray 14 into the IC sockets 34a and 34b in place. As illustrated in FIG. 6, the socket guide 36 may be in the form of a box-shaped frame 40 generally rectangular in a plan view formed with two IC guide apertures 41a and 41b on the bottoms of which the aforesaid IC sockets 34a and 34b are to be mounted. Upstanding from the top surface of the box-shaped frame 40 are pairs of guide pins 42a and 42b positioned at the opposite sides of the associated IC guide apertures 41a and 41b. The pairs of guide pins 42a and 42b are configured to position the two associated suction means (chucks) for vacuum attracting and holding the ICs 15 to be tested placed on the test tray 14 and transferring them onto the IC sockets 34a and 34b. The chucks have locating apertures and are adapted to precisely guide and mount the ICs 15 to be tested carried thereby into the IC sockets 34a and 34b as the locating apertures fitted over the corresponding pairs of guide pins 42a and 42b.

FIG. 7 illustrates another example of the test section 21 of the conventional IC handler wherein the base 10a of the IC handler body has an opening 31 (rectangular in this example) formed therethrough around which an IC socket securing plate 51 formed of an insulating material is affixed to the undersurface of the base 10a by means of fastening means such as screws or the like, not shown. The socket guide 36 is fixed to this IC socket securing plate 51. It is thus to be seen that the IC socket securing plate 51 of insulating material forms a part of the bottom wall of the constant temperature chamber 20 to ensure that the interior of the chamber 20 is maintained in a thermally insulated condition.

As in the example of FIG. 5, the socket guide 36 has mounted therein two IC sockets (of which only one 34a located toward the viewer is visible in the drawing since FIG. 7 is a view rotated 90° from that of FIG. 5). The IC sockets 34a and 34b are exposed within the constant temperature chamber 20 so as to receive ICs to be tested as conveyed into the test section 21 inside the chamber 20 for testing of the electrical characteristics of the ICs.

In this example, a cylindrical performance board retainer 52 is attached to the upper surface of the performance board 35, the arrangement being such that once the IC socket securing plate 51 has been affixed to the base 10a around the opening 31, the performance board 35 may be brought into electrical contact with the IC sockets through two adaptor sockets 53, 53 in this example by raising the performance board 35 (and hence the test head 32) by means of the sliding movement of the performance board retainer 52 until just before the top face of the performance board retainer 52 comes into abutment with the bottom of the handler body base 10a. In this way, a test pattern signal corresponding to the ICs to be tested from the test head 32 are applied through the performance board 35 and the adaptor sockets 53, 53 to the associated terminals of the IC sockets to effect the testing of the ICs. The electrical connecting means other than the adaptor sockets such as cables, for example, may be used to electrically connect the performance board 35 with the IC sockets. The IC sockets and the socket guide are similar in construction to those of the test section 21 shown in FIG. 5.

FIG. 8 illustrates still another example of the prior art test section 21 wherein the socket guide 36 for mounting IC sockets therein is formed of an insulating material and is affixed to the undersurface of the base 10a of the IC handler body around an opening 31 (rectangular in this example as well) by means of fastening means such as screws or the like, not shown with an insulating member 55 interposed between the base 10a and the guide 36. This insulating member 55 is attached to the upper surface of the socket guide 36 around its outer margin and cooperates with the insulated socket guide 36 to maintain the interior of the constant temperature chamber 20 in a thermally insulated condition.

That portion of the bottom surface of the base 10a of the IC handler body surrounding the opening 31 is upwardly recessed at 54 to allow the top face of the cylindrical performance board retainer 52 attached to the upper surface of the performance board 35 to be moved closer to the constant temperature chamber 20. Stated otherwiser that portion of the bottom surface of the base 10a of the IC handler body surrounding the opening 31 is made thinner than the rest to define a recess 54.

Like the foregoing examples, the socket guide 36 has mounted therein two IC sockets (of which only one 34a located toward the viewer is visible in the drawing as is the case with FIG. 7). The IC sockets 34a and 34b are exposed in the constant temperature chamber 20 so as to receive ICs to be tested as conveyed into the test section 21 inside the chamber 20 for testing of the electrical characteristics of the ICs.

In this example as in that of FIG. 7, a cylindrical performance board retainer 52 is attached to the upper surface of the performance board 35 in such a manner that once the socket guide 36 has been affixed to the base 10a around the opening 31, the performance board 35 may be brought into electrical contact with the IC sockets through one adaptor socket 53 in this example by raising the performance board 35 by means of the sliding movement of the performance board retainer 52 until just before the top face of the performance board retainer 52 comes into abutment with the bottom of the handler body base 10a. In this manner, a test pattern signal corresponding to the ICs to be tested from the test head 32 are applied through the performance board 35 and the adaptor socket 53 to the associated terminals of the IC sockets to effect the testing of the ICs. Obviously, the electrical connecting means other than the adaptor socket such as cables, for example may be used to make electrical connection between the performance board 35 and the IC sockets. The IC sockets and the socket guide are similar in construction to those of the test section 21 shown in FIG. 5.

In the prior art example shown in FIG. 5, the use of the box-shaped mounting fixture 33 (Hi-fix base) increases the distance between the performance board 35 and the IC sockets 34a, 34b, leading to failure to effect precise testing due to occurrence of jitter if a signal of 10 ns is applied. Accordingly, there was a disadvantage that it was impossible to test high speed operating devices. Another disadvantage was that specialized box-shaped mounting fixtures 33 were required depending on the type (configuration) of ICs to be tested and hence were expensive.

In the prior art example shown in FIG. 7, the distance between the performance board 35 and the IC sockets 34a, 34b is reduced as compared with the example of FIG. 5, owing to the arrangement wherein the socket securing plate 51 formed of insulating material is affixed to the undersurface of the base 10a of the IC handler body around the opening 31 with the socket guide 36 attached to the socket securing plate 51. Nevertheless, if a signal of 10 ns is applied, there would still occur undesirable jitters, resulting in failure to effect precise testing. Consequently, the example of FIG. 7 still has the disadvantage that it has difficulties with testing high speed operating devices.

Further, in the prior art example shown in FIG. 8, the socket guide 36, formed of an insulating material, is affixed to the undersurface of the base 10a of the IC handler body around the opening 31 with the insulating member 55 interposed between the base 10a and the guide 36 and wherein that portion of the bottom surface of the base 10a of the IC handler body surrounding the opening 31 is upwardly recessed to form a recess 54. This construction substantially reduces the distance between the performance board 35 and the IC sockets 34a, 34b, so that even if a signal of 10 ns, for instance, is applied, any jitter would hardly occur, thereby permitting precise testing of high speed operating devices.

However, it is required that the recess 54 in the base 10a of the IC handler body surrounding the opening 31 be somewhat greater than the size (the distance between the opposed external walls) of the performance board retainer 52 overlying the performance board 35 on the side of the test head 32. For this reason, conventionally the base 10a of the IC handler body is formed with a recess 54 sized so as to accommodate a performance board having a performance board retainer 52 which has an expected maximum size. Not only does it require complicated working to form a recess 54 in the base 10a of the IC handler body, but also a uselessly oversized recess would be formed in the base 10a of the IC handler body for a small sized performance board retainer 52. On the contrary, with a performance board having a performance board retainer 52 of a greater size than expected, it would be impossible to execute the testing. Consequently, it was required to prepare a base 10a of the IC handler body formed with a recess 54 of a correspondingly increased size.

SUMMARY OF THE INVENTION

It is an object of the present invention to provide an IC handler which is capable of testing even high speed operating devices with high precision and reliability due to a reduced spacing between the performance board and the IC sockets.

Another object of the present invention is to provide an IC handler in which a mounting fixture (which is a jig called "Hi-fix base" or "test fixture") for connecting the test head of the IC tester with the constant temperature chamber is configured to be easily detachably attached to the base of the IC handler body, with means being provided for easily mounting IC sockets for various types of IC devices into a socket guide affixed to the mounting fixture, which is capable of testing all types (configurations) IC devices with accuracy and ease, and which is easy and inexpensive to manufacture.

The foregoing objects of the present invention are accomplished by an IC handler comprising a constant temperature chamber for maintaining semiconductor devices to be tested at a predetermined constant temperature, a test section disposed inside the constant temperature chamber for testing the semiconductor devices, and means for transporting a semiconductor device to be tested to the test section. The constant temperature chamber of the present invention has an opening formed in the bottom thereof to which is attached a mounting fixture for connecting a test head of a semiconductor device testing apparatus to the constant temperature chamber. The IC handler of the present invention further comprises a performance board mounted on the surface of the test head of the IC tester, securing means for detachably attaching the mounting fixture to the opening formed in the bottom of the constant temperature chamber, an opening formed generally in the center of the mounting fixture, a socket guide having at least one socket mounted therein and mounted on the surface of the performance board, and a second securing means for detachably attaching the socket guide to the undersurface of the mounting fixture such that the socket is exposed through the opening formed in the mounting fixture, whereby the electric path between the performance board and the socket may be minimized in length.

With the construction according to this invention, the mounting fixture for connecting the test head of the IC tester with the constant temperature chamber is configured to be detachable with respect to the base of the body of the IC handler, and the socket guide having IC sockets mounted therein is configured to be detachable with respect to the mounting fixture, whereby it is possible to mount the IC sockets even directly on the performance board of the test head, not to speak of the ability to mount the socket guide on the performance board, so that the electric path between the performance board and the IC sockets may be minimized in length. As a result, even if a signal of 10 ns, for instance, is applied, no jitter occurs, thereby ensuring high precision testing. It is thus possible to test even high speed operating IC devices with precision and reliability. In addition, it is possible to carry out the testing utilizing all types of test heads by preparing various mounting fixtures matching with the test heads used. Moreover, it is also possible to prepare socket guides having configurations matching with the various types of IC sockets thereby enabling the testing of various types of ICs with high precision.

DESCRIPTION OF THE PREFERRED EMBODIMENTS

Preferred embodiments of the invention will be described in details with reference to the accompanying drawings.

Figure 1:
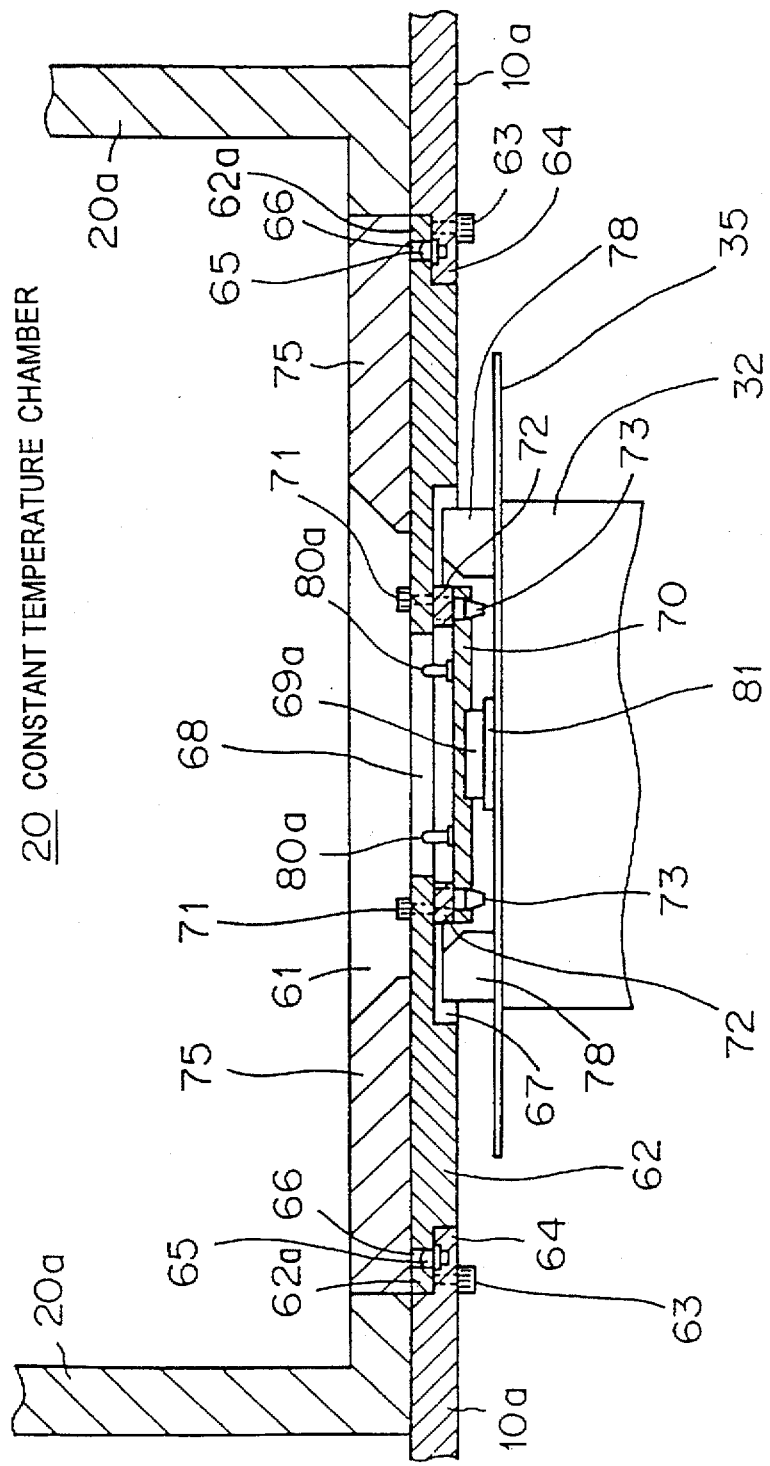
FIG. 1 is a schematic cross-sectional view showing one embodiment of the test section of the IC handler according to this invention.
Figure 7:
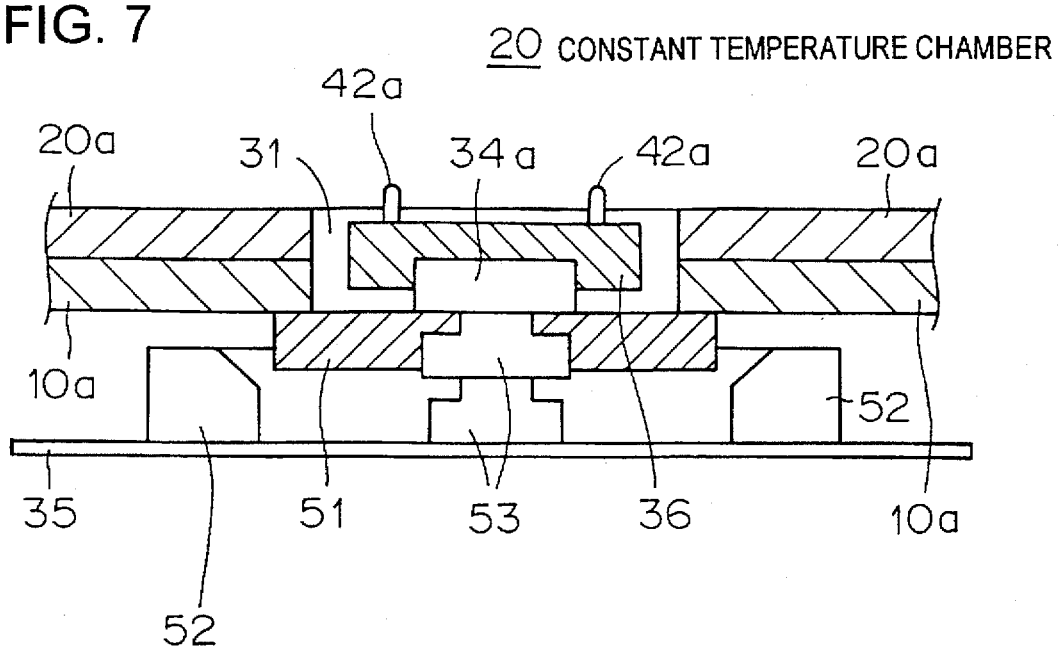
FIG. 7 is a schematic cross-sectional view illustrating another example of the conventional test section of the IC handler.
Figure 8:
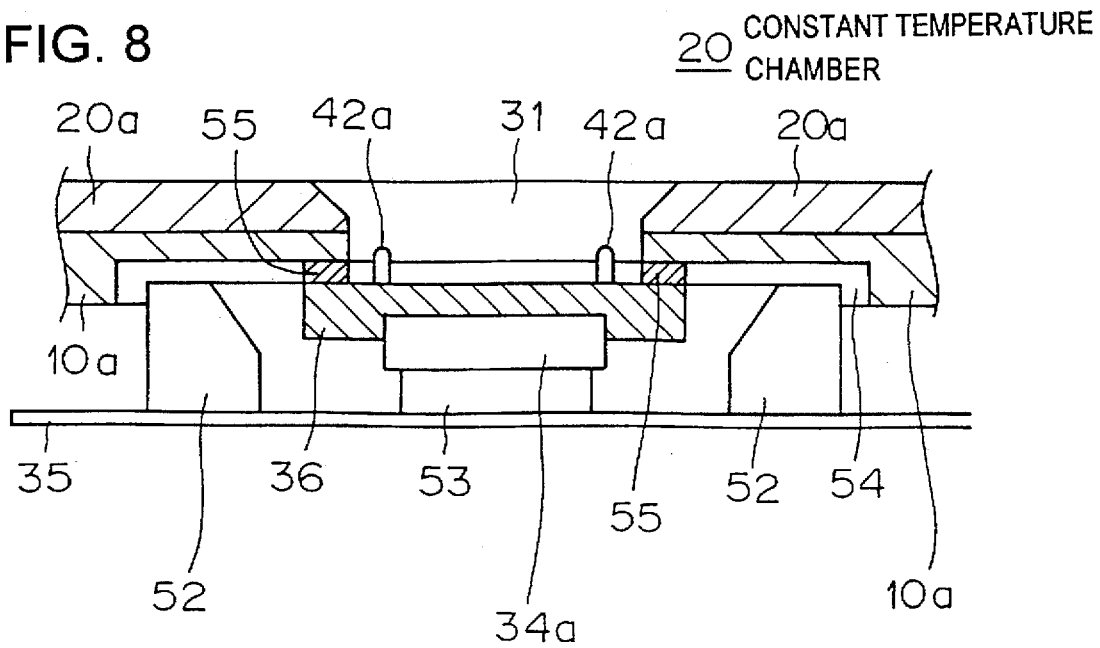
FIG. 8 is a schematic cross-sectional view illustrating still another example of the conventional test section of the IC handler.

FIG. 1 is a schematic cross-sectional view showing the construction of a first embodiment of the test section of the IC handler according to this invention. As discussed above, the constant temperature chamber 20 (FIGS. 7 and 8) is of a thermally insulated construction with the bottom insulation wall 20a affixed to the base 10a of the IC handler body to define a double-walled construction with the insulation wall 20a superimposed on the base 10a.

In this embodiment, an opening 61 generally angular U-shaped in a plan view (such as a generally angular U-shaped cut-out extending from the front as viewed in FIG. 1) is formed in that portion of the base 10a of the IC handler body corresponding to the bottom of the constant temperature chamber 20 as well as in the bottom of the chamber itself. A mounting fixture 62 (which is a jig known as "Hi-fix base" or "test fixture") for connecting the test head 32 of the IC tester with the constant temperature chamber 20 is fitted in the opening 61 and secured to the base 10a of the IC handler body by suitable securing means or fastening means such as fastening screws 63 which are adapted to be operated from the undersurface side of the mounting fixture 62. The peripheral edge of the base 10a of the IC handler body surrounding the generally U-shaped opening 61 is formed with a stepped ledge 64 generally U-shaped in a plan view. A guide pin 65 is staked to and upwardly extends from each of the left and right side (as viewed in the drawing) sections at a predetermined position of the U-shaped stepped ledge 64.

Figure 2:
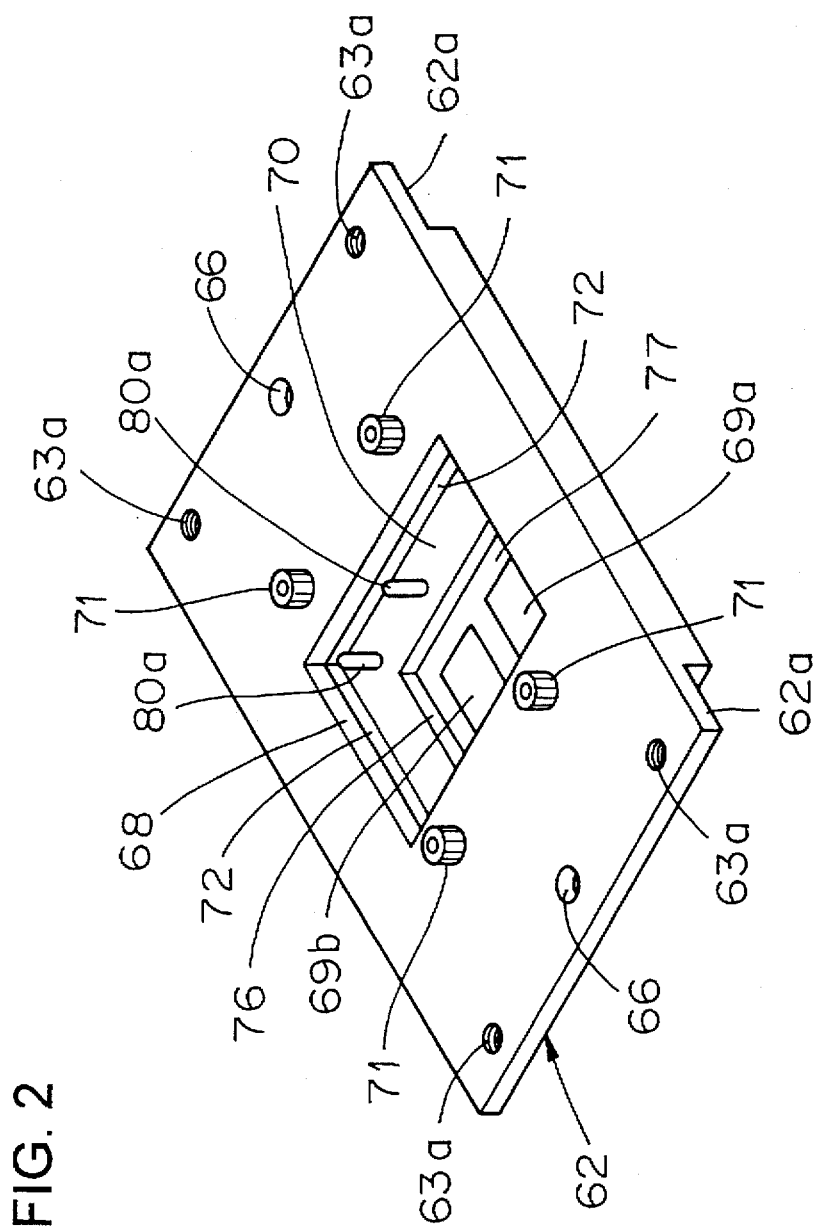
FIG. 2 is a schematic perspective view showing one embodiment of the mounting fixture and the socket guide useful in the test section of the IC handler of FIG. 1 with the insulating member removed.

As best seen in an enlarged detailed view in FIG. 2, the mounting fixture 62 fitted in the opening 61 is of a generally rectangular shape in a plan view and formed with a stepped flange 62a generally U-shaped in a plan view extending around three sides (two shorter sides and one distant from the viewer in this embodiment) of the rectangle, the stepped flange 62a mating with the stepped ledge 64 of the base 10a of the IC handler body. More specifically, the peripheral edge of the mounting fixture 62 along three sides thereof is undercut so as to define an inversely stepped flange 62a. It should be noted that the mounting fixture 62 has substantially the same thickness as that of the base 10a of the IC handler body so that when the mounting fixture 62 is assembled to the base 10a of the IC handler body, they form a virtually single continuous base plate with their steps 62a and 64 complementarily superimposed one on another.

Formed through the opposed left and right side sections of the step 62a are a pair of guide holes 66 for receiving the corresponding guide pins 65 upstanding from the opposed left and right side sections of the step 64 of the base 10a of the IC handler body so that as the mounting fixture 62 is inserted in the constant temperature chamber 20 and is secured to the opening 61 by fastening screws 63, the guide holes 66 of the mounting fixture 62 may be fitted over the guide pins 65 of the base 20a. The mounting fixture 62 may thus be accurately positioned in place in the opening 61. Once the mounting fixture 62 has been positioned by fitting the guide holes 66 over the guide pins 65 of the base 20a, two fastening screws 63 are passed through each of the opposed left and right side sections of the step 64 of the base 10a upwardly from below and threaded into aligned threaded holes 63a (see FIG. 2) formed through the left and right side sections of the step 62a of the mounting fixture 62.

The undersurface of the mounting fixture 62 is formed centrally with a recess 67 which has a generally rectangular central opening 68. The opening 68 is designed to expose two IC sockets 69a, 69b mounted in a socket guide 70 to the constant temperature chamber 20. The socket guide 70 is secured in the recess 67 of the undersurface of the mounting fixture 62 by suitable securing means or fastening means such as fastening screws 71, as will be described in more details hereinbelow. As is clearly seen in FIG. 2, two such fastening screws 71 spaced apart by a predetermined distance are located adjacent each of the opposed longer sides of the opening 68 so that they may be manipulated from above the upper surface of the mounting fixture 62 to be threaded into the socket guide 70 to fasten the latter.

As is apparent from FIG. 1, the socket guide 70 has a pair of opposed guide holes formed through the left and right end portions so that as the socket guide 70 is assembled to the mounting fixture 62, a pair of socket guide locating pins 73 projecting downwardly from the recess 67 of the mounting fixture 62 are fitted into the vertically aligned guide holes in the socket guide 70 to accurately define the mounting position of the socket guide 70 relative to the mounting fixture 62 to thereby ensure that the socket guide 70 is always accurately positioned in place with respect to the mounting fixture 62. Attached to the socket guide 36 around its periphery is a frame-like insulating member 72 through which the socket guide 70 is secured to the recess 67 in the undersurface of the mounting fixture 62. Accordingly, the insulating member 72 is also formed with through holes in alignment with the socket guide locating pins 73. Alternatively, however, the socket guide locating pins 73 and the associated guide holes may be positioned so as not to intersect with the insulating member 72. In a further alternative embodiment, socket guide locating pins 73 may be staked to and depend from the undersurface of the insulating member 72 so that the mounting position of the socket guide 70 relative to the mounting fixture 62 is precisely defined when securing the socket guide 70 to the mounting fixture 62. It is noted that the IC sockets 69a, 69b and guide pins 80a, 80b upstanding therefrom are shown in a side view in FIG. 1 for convenience sake.

Furthermore, affixed to the upper surface of the mounting fixture 62 is another frame-like insulating member 75 (which is shown as removed in FIG. 2) extending over the fixture from outside of the central opening 68 to the outer peripheral edge of the fixture. The thickness of the insulating member 75 is selected to be substantially equal to that of the bottom insulation wall 20a of the constant temperature chamber 20 so that when the mounting fixture 62 is assembled to the base 10a of the IC handler body, the insulating member 75 comes into abutment with the insulation wall 20a fixed to the upper surface of the base 10a of the IC handler body to form a virtually integral insulation wall. It is thus to be understood that the mounting fixture 62 in this embodiment forms a part of the bottom (base 10a and bottom wall of the constant temperature chamber) serves to maintain the interior of the constant temperature chamber 20 in a thermally insulated condition.

Figure 4:
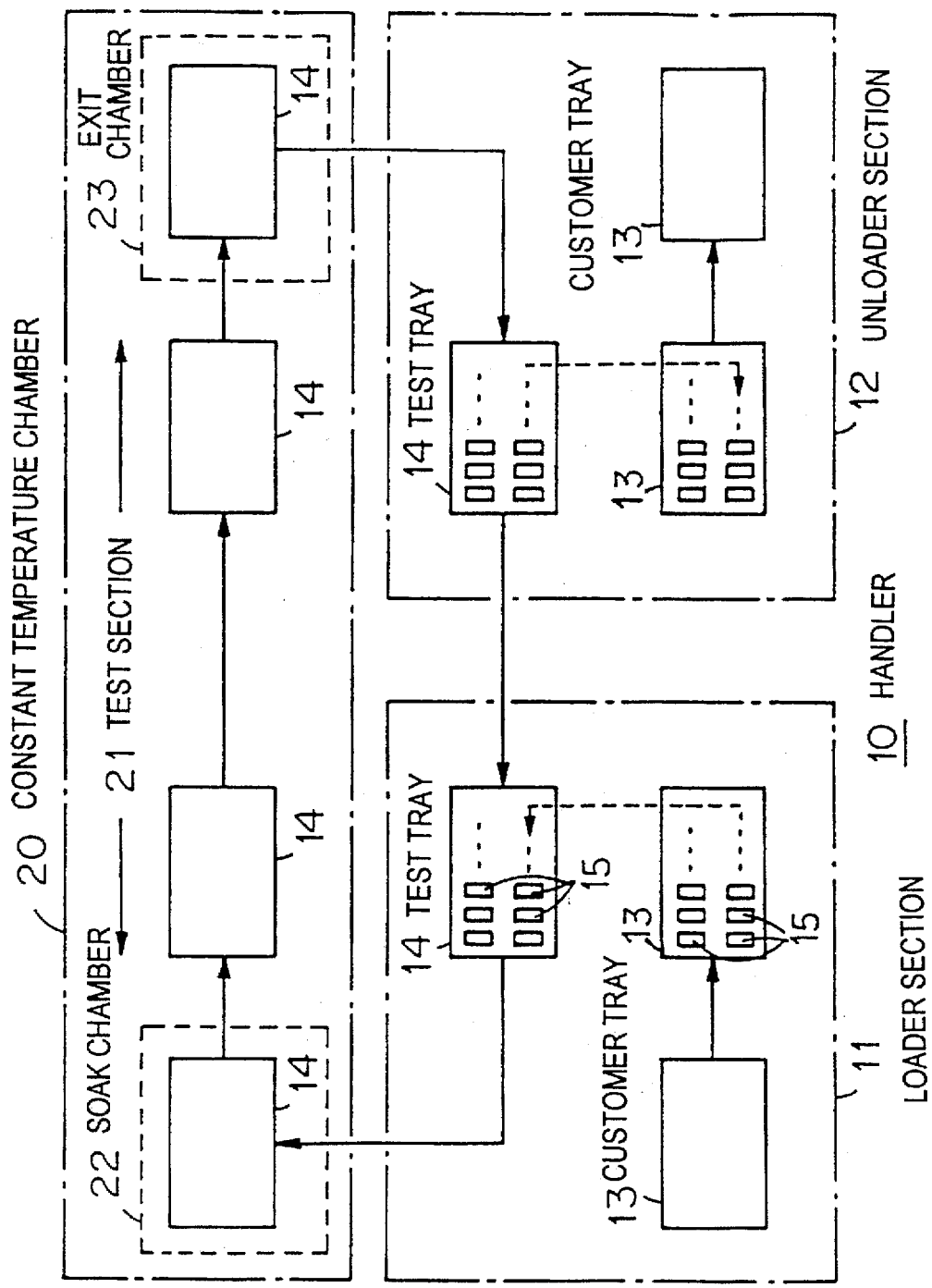
FIG. 4 is a diagrammatical illustration of the general arrangement of an example of the IC handler of the conventional forced horizontal transporting type in the form of a flow chart.
Figure 5:
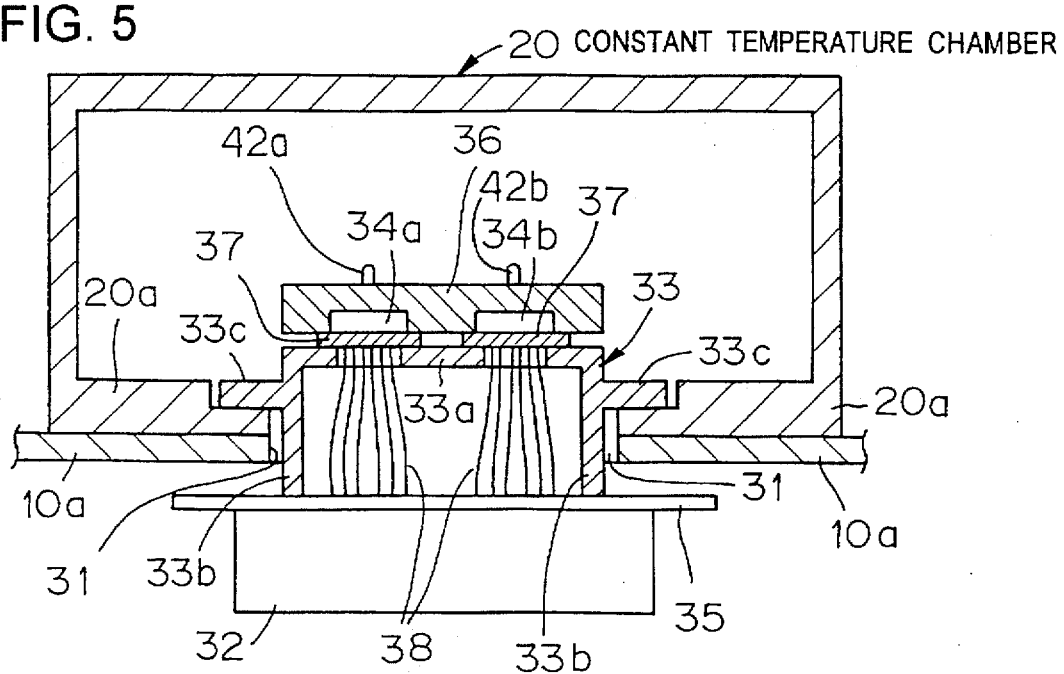
FIG. 5 is a schematic cross-sectional view illustrating one example of the conventional test section of the IC handler.
Figure 6:
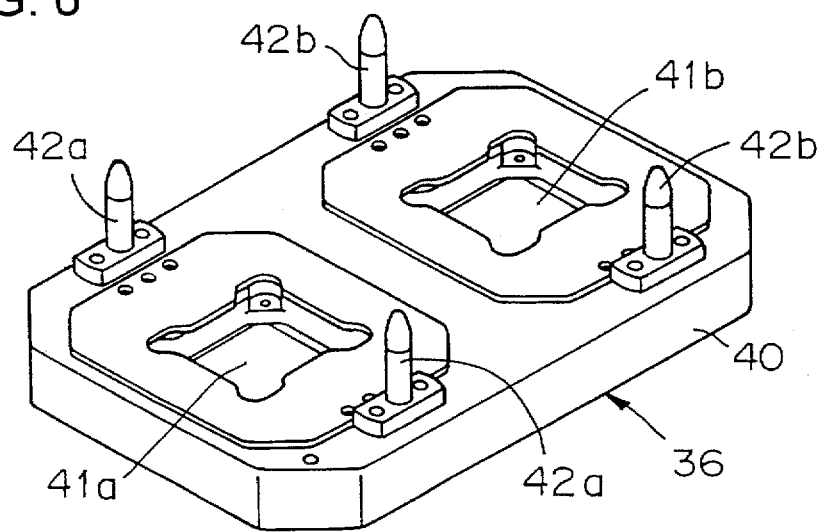
FIG. 6 is a schematic cross-sectional view illustrating one example of the socket guide used with the test section of the IC handler of FIG. 5.

As in the prior art examples as described above, since the IC handler to which the present invention is applied is also designed to test two ICs simultaneously, two IC sockets 69a and 69b are shown as mounted in the socket guide 70. Needless to say, however, the number of IC sockets and the configuration of the socket guide may be varied depending on the type of the IC handler. As is the case with the foregoing prior art examples, the socket guide 70 is to guide and mount the ICs 15 (see FIG. 4) to be tested as conveyed from the test tray 14 in place into the IC sockets 69a and 69b, and is formed from a generally rectangular plate consisting of insulating material. As illustrated in FIG. 2, the socket guide is formed with two generally rectangular through apertures 76 for exposing IC sockets. In this embodiment, the IC sockets 69a and 69b are carried on a common socket board 77. When the socket board 77 carrying the IC sockets 69a and 69b thereon is mounted to the bottom of the socket guide 70, the IC sockets 69a and 69b mounted in the socket guide 70 are exposed through the through apertures 76.

A pair of guide pins 80a and 80b (guide pins 80b closer to the view are invisible in FIG. 2) extend upwardly from the top surface of the socket guide 70 at diagonally opposed positions across each of the IC sockets 69a and 69b. The pairs of guide pins 80a and 80b are designed to position the two associated suction means (such as chucks) for vacuum attracting and holding the ICs 15 to be tested placed on the test tray 14 and transferring them onto the IC sockets 69a and 69b. The chucks have locating apertures and are adapted to precisely guide and mount the ICs 15 to be tested carried thereby into the IC sockets 69a and 69b as the locating apertures fitted over the corresponding pairs of guide pins 80a and 80b. The pairs of guide pins 80a and 80b may be staked to the socket board rather than the socket guide.

The socket guide 70 configured as described above is attached to the top of a performance board 35 which is in turn fixed to the top of a test head 32, with an adaptor socket 81 interposed between the performance board 35 and each of the IC sockets 69a and 69b. Evidently, such adaptor sockets 81 may be omitted if the IC sockets 69a and 69b are mounted directly the performance board 35.

Once the socket guide 70 has been affixed to the top of the performance board 35, the performance board 35 (and hence the test head 32) may be raised by means of the sliding movement of a performance board retainer 78 which is also affixed to the top of the performance board 35 until just before the top face of the performance board retainer 78 comes into abutment with the bottom of the recess 67 in the mounting fixture 62 so that the socket guide locating pins 73 of the mounting fixture 62 are fitted into the guide holes in the socket guide 70 to thereby position the socket guide 70 in place relative to the mounting fixture 62 through the insulating member 72. Then, the socket guide 70 is secured to the undersurface of the mounting fixture 62 by fastening screws 71. In this way, a test pattern signal corresponding to the ICs to be tested from the test head 32 is applied through the performance board 35 and the adaptor sockets 81 to the associated terminals of the IC sockets 69a, 69b to effect the testing of the ICs. The electrical connecting means other than the adaptor sockets such as cables, for example may be used to electrically connect the performance board 35 with the IC sockets 69a, 69b.

Figure 3:
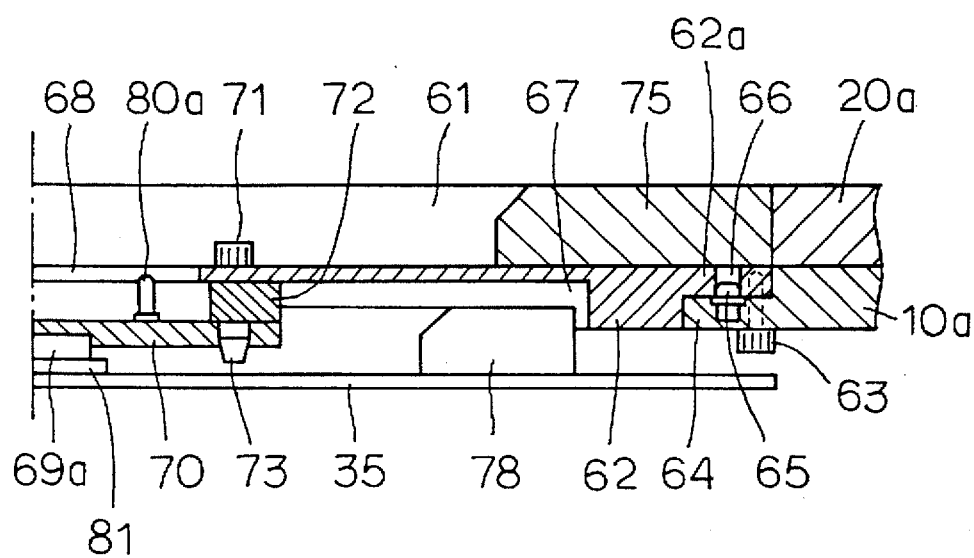
FIG. 3 is a schematic cross-sectional view of another embodiment of the test section of the IC handler according to this invention.

FIG. 3 is a schematic cross-sectional view of a second embodiment of the test section of the IC handler according to this invention. In FIG. 3, those components which correspond to components shown in FIGS. 1 and 2 are designated by like reference numerals and will not be further described unless needed. Further, one half of the apparatus is not shown since it is of a construction symmetrical about the center line of the apparatus.

This embodiment illustrates a modified form of the mounting fixture 62 which is configured to suit a test head 32 equipped with a performance board 35 having mounted thereon a performance board retainer 78 of a greater outer dimension. For the performance board retainer 78 having a greater outer dimension carried by the performance board 35, it is required to correspondingly enlarge the recess 67 in the undersurface of the mounting fixture 62. According to this invention, since the mounting fixture 62 is detachable with respect to the base 10 of the body of the IC handler and the socket guide 70 is also detachable with respect to the mounting fixture 62, it is possible to prepare various mounting fixtures 62 corresponding to various types of test heads expected to be used and to interchangeably mount any desired one of the test heads with ease. As is understood from the embodiments of FIGS. 1 and 3, all types of test heads may be accommodated by keeping in stock various mounting fixtures 62 having differently sized recesses 67 formed in their undersurfaces. In addition, it is also possible to prepare socket guides having shapes and constructions corresponding to the various types of IC sockets, thereby enabling the testing of various types of ICs with high precision.

While both the mounting fixture 62 and the recess 67 formed in its undersurface are of rectangular shape in a plan view in the embodiments illustrated herein, the recess 67 may be circular, and correspondingly circular the socket guide 70 may be. In an further alternative, the mounting fixture 62 and the recess 67 may be circular while socket guide 70 may be rectangular or circular. The shape and construction of the mounting fixture 62, recess 67, socket guide 70, performance board 35 and performance board retainer 78 may be modified and varies as required.

As is evident from the foregoing discussion, according to this invention, the mounting fixture (a jig called "Hi-fix base" or "test fixture") for connecting the test head of the IC tester with the constant temperature chamber is configured to be detachable with respect to the base of the IC handler body, and the socket guide having IC sockets mounted therein is configured to be detachable with respect to the mounting fixture. Consequently, it is possible to mount the IC sockets even directly on the performance board of the test head, so that the electric path between the performance board and the IC sockets may be minimized in length. As a result, even if a signal of 10 ns, for in stance, is applied, no jitter occurs, thereby ensuring high precision testing. Stated otherwise, it is possible to test even high speed operating IC devices with precision and reliability.

In addition, it is possible to carry out the testing utilizing all types of test heads by preparing various mounting fixtures corresponding to the test heads used. Moreover, it is also possible to prepare socket guides having shapes and constructions matching with the various types of IC sockets, thereby enabling the testing of various types of ICs with high precision.

It should here be noted that preparing various mounting fixtures corresponding to the test heads expected to be used is very advantageous in terms of both manufacturing and costs, as compared with the facts that a recess is formed in the undersurface of the base of the IC handler body and that the base itself of the IC handler body must be replaced for any test head that it cannot accommodate. On top of that, the present invention provides easiness in processing in that it is only required to form simple openings in the bottom wall and the base of the IC handler body.

What is claimed is:

1. An IC handler transporting semiconductor devices and coupled to a test head of a semiconductor device testing apparatus, said IC handler comprising:

a constant temperature chamber maintaining the semiconductor devices to be tested at a predetermined constant temperature and comprising an opening formed in the bottom thereof;

a test section disposed inside of the constant temperature chamber and testing the semiconductor devices;

means for transporting one of the semiconductor devices to be tested to said test section a mounting fixture attached to the opening formed in the bottom of the constant temperature chamber and connecting the test head of the semiconductor device testing apparatus to the constant temperature chamber, said mounting fixture including an opening formed generally in the center of said mounting fixture;

a performance board mounted on a surface of said test head of the semiconductor device testing apparatus;

securing means for detectably attaching said mounting fixture to said opening formed in the bottom of the constant temperature chamber;

a socket guide comprising at least one socket mounted therein and mounted on the surface of said performance board; and second securing means for detachably attaching said socket guide to the undersurface of said mounting fixture such that said at least one socket is exposed through said opening formed in the mounting fixture, whereby an electric path between said performance board and said at least one socket is minimized in length.

2. The IC handler according to claim 1, further comprising a performance board retainer mounted on the surface of said performance board, wherein said mounting fixture comprises a recess formed in its undersurface surrounding said opening formed generally in the center of the mounting fixture such that said performance board retainer enters into said recess.

3. The IC handler according to claim 1, wherein said mounting fixture and the bottom of said constant temperature chamber each comprise locating means for engaging with each other, so that as said mounting fixture is detachably attached to the bottom of the constant temperature chamber, the mounting fixture is accurately guided into position at the bottom of the constant temperature chamber.

4. The IC handler according to claim 1, wherein said mounting fixture and said socket guide each comprise second locating means for engaging with each other, so that as said socket guide is detachably attached to the undersurface of the mounting fixture, the socket guide is accurately guided into position at the undersurface of the mounting fixture.

* * * * *